(12) United States Patent
Maruko

(10) Patent No.: US 7,303,843 B2
(45) Date of Patent: Dec. 4, 2007

(54) PHOTOMASK AND METHOD FOR EXPOSING CHIP PATTERN

(75) Inventor: Tuguto Maruko, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/592,149

(22) Filed: Nov. 3, 2006

(65) Prior Publication Data
US 2007/0048632 A1    Mar. 1, 2007

Related U.S. Application Data

(62) Division of application No. 10/673,572, filed on Sep. 30, 2003, now Pat. No. 7,150,948.

(30) Foreign Application Priority Data
Oct. 18, 2002    (JP)    ............................. 2002-304002

(51) Int. Cl.
*G03F 9/00* (2006.01)
(52) U.S. Cl. ............................................ 430/5; 430/22
(58) Field of Classification Search .................... 430/5, 430/22
See application file for complete search history.

(56) References Cited

U.S. PATENT DOCUMENTS 7,150,948 B2 *    12/2006    Maruko ........................ 430/22

FOREIGN PATENT DOCUMENTS

| JP | 1-239555 | 9/1989 |
|---|---|---|
| JP | 2-127640 | 5/1990 |
| JP | 6-20911 | 1/1994 |
| JP | 9-134870 | 5/1997 |
| JP | 11-305418 | 11/1999 |

* cited by examiner

*Primary Examiner*—Christopher G. Young
(74) *Attorney, Agent, or Firm*—Wenderoth, Lind & Ponack, L.L.P.

(57) ABSTRACT

A photomask includes a main mask pattern having first chip patterns and having a first size corresponding to a maximum exposure area of a projection exposure apparatus. The mask further includes a sub-mask pattern having second chip patterns different from the first chip patterns, having a second size smaller than the first size, and arranged adjacently to the main mask pattern.

6 Claims, 16 Drawing Sheets

US 7,303,843 B2

PHOTOMASK AND METHOD FOR EXPOSING CHIP PATTERN

This application is a divisional of U.S. application Ser. No. 10/673,572, filed Sep. 30, 2003 now U.S. Pat. No. 7,150,948.

BACKGROUND OF THE INVENTION

1. Field of the Invention

The invention relates to a photomask for exposing a chip pattern onto a wafer and a method for exposing a chip pattern.

This application is a counterpart of Japanese patent application, Serial Number 304002/2002, filed Oct. 18, 2002, the subject matter of which is incorporated herein by reference.

2. Description of the Related Art

Before mass-producing chips, a prototype of a chip is always fabricated and the prototype of the chip has to be evaluated. In order to manufacture the prototype of the chip, a reticle mask (one type of a photomask) on which a chip pattern, corresponding to a prototype of the chip, is formed and fabricated.

For a reticle mask for prototype use, a reticle mask 100 on which only the same types of chip patterns A are formed, as shown in FIG. 15(A), and a reticle mask (multichip mask) 102 on which multiple types of chip patterns A, B, C are formed at the same ratio, and the like, as shown in FIG. 15(B), have been conventionally used.

There is an advantage that the reticle mask 100 for prototype use can be used for mass production, as if there is no problem. However, if any problem arises in the chip patterns A, it is necessary to design and fabricate again a reticle mask for forming a chip pattern for prototype use in place of the chip patterns A, and hence it takes time to make the transition to the mass-production. Further, for the multichip mask 102, it is necessary to design and fabricate again a mask for mass-production so as to utilize the exposure area of the projection exposure apparatus (the apparatus is called as an aligner or a stepper) for mass-production to the greatest extent, and hence there arises a problem of increase of cost.

Further, as shown in FIG. 16, there is proposed a method of exposing only an intended chip of a multichip mask 104 on which multiple (four types in FIG. 16) different patterns are formed onto a wafer 108 using a projection lens 106, for example, as disclosed in Japanese Laid-Open Patent No. 11-305418, and also there is proposed a method of exposing only an intended chip on a wafer while shielding an exposure area other than the intended chip, for example, as disclosed in Japanese Laid-Open Patent No. 06-020911.

However, these methods have a problem that it takes much time for processing chips because the exposure area is not utilized to the greatest extent.

SUMMARY OF THE INVENTION

The present invention has been developed in view of the foregoing problem of the prior art, and it is an object of the present invention to fabricate prototype and mass-produce chips by the same photomask and the exposing area of the projection exposure apparatus can be utilized to the greatest extent.

The photomask in one aspect of the present invention is that a first mask pattern which has first chip patterns and which has a first size corresponding to a maximum exposure area of a projection exposure apparatus; and a second mask pattern which has second chip patterns different from the first chip patterns, which has a second size smaller than the first size, and which is arranged adjacently to the first mask pattern.

According to the photomask of the aspect of the present invention, multiple same first chip patterns are formed on the first mask pattern serving as the maximum exposure area of the projection exposure apparatus, and the second chip patterns which are different from the first chip patterns are formed on a second mask pattern provided adjacently to the first mask pattern.

Accordingly, it is possible to expose the first and second chip patterns on the wafer at a time, and the evaluation thereof can be made at the same time. Further, since the maximum exposure area of the projection exposure apparatus can be subjected to exposure in the case of exposing only the same first chip patterns, the time for processing the wafer can be shortened without wasting exposure area.

The photomask in another aspect of the present invention is characterized to be a mask for mass-production.

According to the photomask of the aspect of the present invention, it is not necessary to redesign and re-fabricate a photomask for mass-production if the first chip patterns are evaluated when the chips are prototyped and the first chip patterns satisfy the specification of mass-production, and hence the term for developing chips can be reduced and the fabricating cost of the photomask can be reduced.

The photomask according to still another aspect of the present invention is characterized in that it is the photomask according to abovementioned aspect of the invention and the first mask pattern is provided at the center and the second mask pattern is provided at the periphery of the first mask pattern.

According to the photomask of the aspect of the present invention, first mask pattern is provided at the center and the second mask pattern is provided at the periphery of the first mask pattern. For example, in the case where an area of the second mask pattern is equal to that of the first mask pattern, if the second mask pattern is concentrically provided on one area which is adjacent to the first mask pattern, it becomes an oblong mask, thereby producing a wasteful area at the upper and lower portions thereof. However, if the second mask pattern is provided at the periphery of the first mask pattern while dispersing it, an area of the photomask can be utilized efficiently, thereby not producing a wasteful area. Accordingly, a fabricating cost of the photomask per piece is reduced.

According to still another aspect of the present invention, there is provided a method for exposing chip patterns on a wafer, the method includes providing a photomask which includes a first mask pattern and a second mask pattern, the first mask pattern having first chip patterns and arranged in an area corresponding to a maximum exposure area of a projection exposure apparatus, and the second mask pattern having second chip patterns different from the first chip patterns and arranged adjacently to the first mask pattern. The method also includes aligning the maximum exposure area of the projection exposure apparatus with a part of the first mask pattern and a part of the second mask pattern, and exposing a part of the first chip patterns and a part of the second chip patterns on a first wafer. The method also includes aligning the maximum exposure area of the projection exposure apparatus with the first mask pattern and exposing the first chip patterns on a second wafer.

According to the method of the aspect of the invention, it is possible to evaluate the different chip patterns, i.e., the first chip patterns and the second chip patterns. Then, if there is no problem in the first chip patterns, only the first chip patterns can be exposed onto the wafer without wasting the exposure area of the projection exposure apparatus in the following step. As a result, the time for processing the wafer is shortened.

Further, if there is no problem in the first chip patterns, it is not necessary to redesign or re-fabricate a photomask when transferring from the first step to the second step, thereby shortening the developing time and reducing the fabricating cost of the photomask.

If there is any problem in the first chip patterns and there is no problem in the second chip patterns of the second mask pattern, the photomask where the second chip patterns are formed at the maximum exposure area of the projection exposure apparatus may be immediately designed and fabricated. Accordingly, the developing time of the chips is shortened compared with the case where the first mask pattern alone is formed on the photomask.

DETAILED DESCRIPTION OF THE PREFERRED EMBODIMENT

A preferred embodiment of the present invention is now described with reference to the accompanying drawings.

Figure 1:
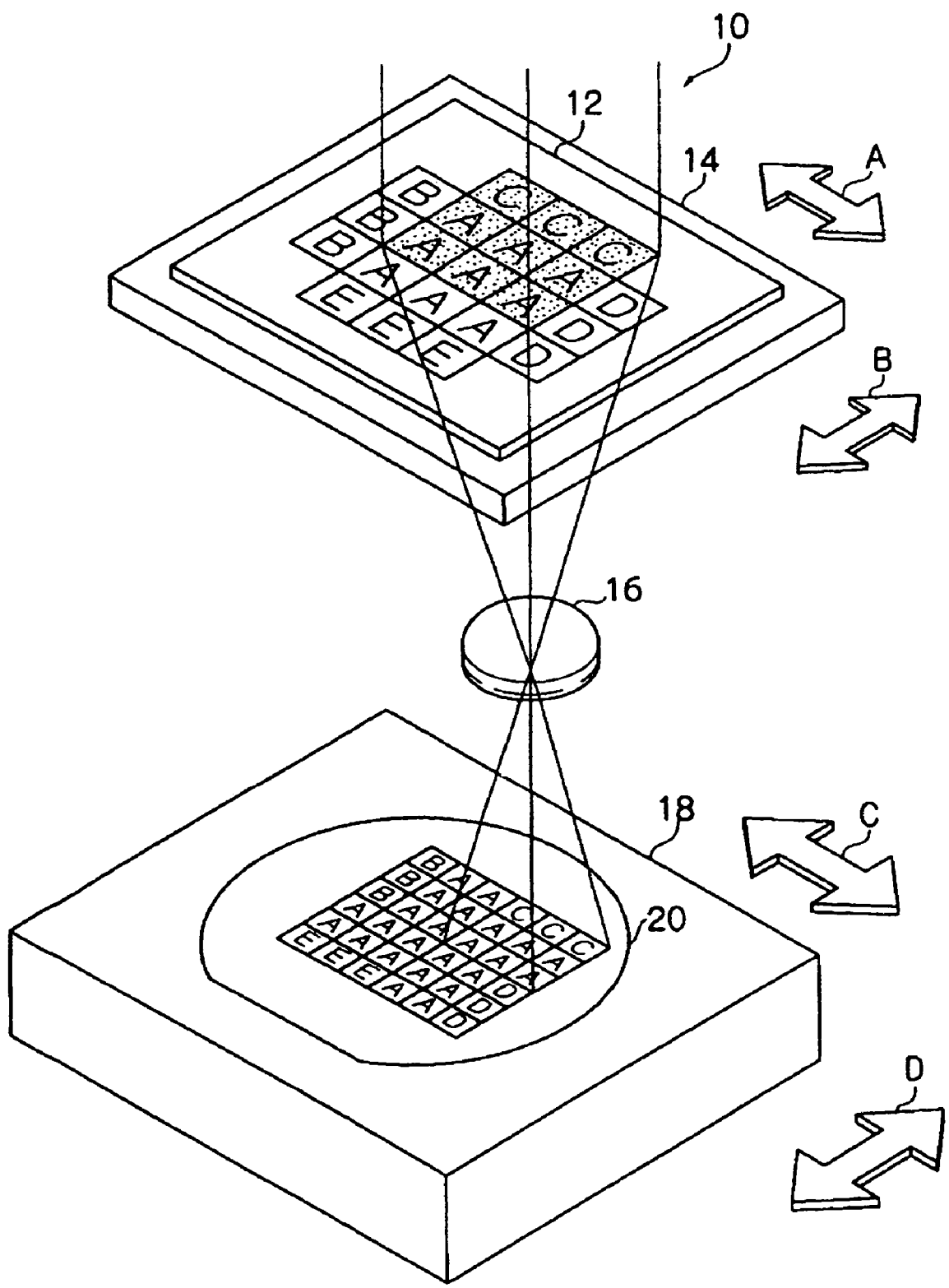
FIG. 1 is a perspective view showing a projection exposure apparatus according to an embodiment of the invention.

As shown in FIG. 1, according to a projection exposure apparatus 10 (the apparatus is called as aligner or stepper), a multichip mask 12 on which multiple types of chip patterns are formed longitudinally and horizontally is set on a reticle stage 14. A projection lens 16, and a wafer stage 18 are respectively disposed under the reticle stage 14. A wafer 20 is set on the wafer stage 18.

According to the aligner 10, light is allowed to enter a maximum exposure area (as illustrated in net in FIG. 1) of the multichip mask 12 to expose each chip pattern. An exposed image of each chip pattern is reduced by the projection lens 16 and transferred onto the wafer 20.

At this time, the reticle stage 14 is moved in the direction of the arrows A and B in the same figure to change an incident area of light while the wafer stage 18 is moved in the direction of arrows C and D so as to transfer multiple types of chip patterns onto the wafer 20 at given positions.

Figure 2:
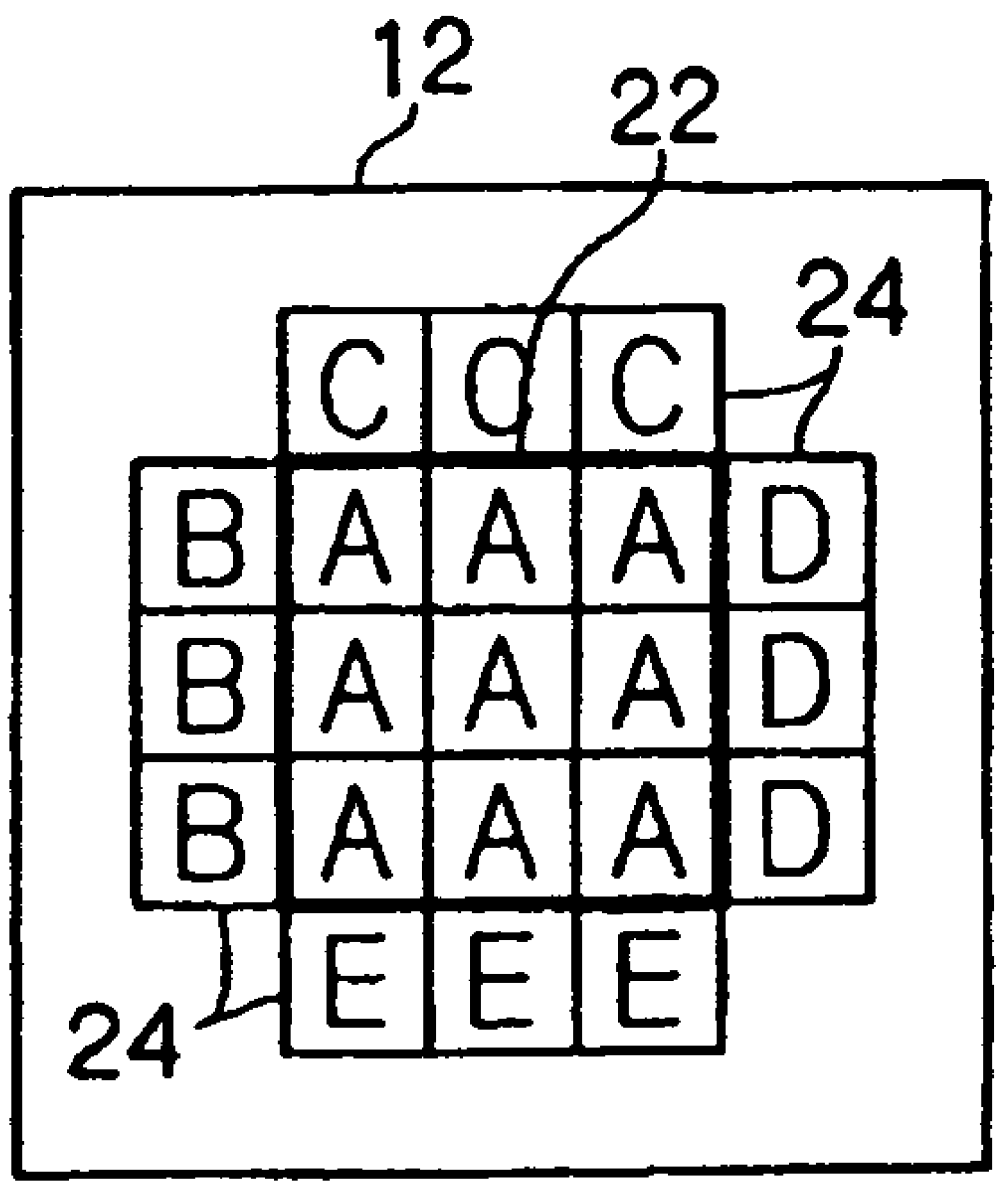
FIG. 2 is a perspective view showing a multichip mask according to the embodiment of the invention.

As shown in FIG. 2, five types of chip patterns A, B, C, D, E are formed on the multichip mask 12. The chip patterns A number of which is nine in total are arranged vertically and horizontally by three at the center of the multichip mask 12. An area 22 (illustrated as half-tone dot meshing) serving as the main mask pattern on which nine chip patterns A are disposed forms a maximum exposure area of the projection exposure apparatus 10.

Three chip patterns B are arranged vertically in series on an area 24 which is a sub-mask pattern and provided at the periphery of the area 22 at the left side of the area 22, wherein three chip patterns C are arranged horizontally at the upper side of the area 22. Further, three chip patterns D are arranged vertically in series at the right side of the area 22 and three chip patterns E are arranged horizontally in series at the lower side of the area 22.

For example, if the area 24 is concentrically provided at one spot adjacent to the area 22, an area where chip patterns are arranged becomes long sideways, to form a wasteful area at the upper and lower portions of the mask. However, when the area 24 is provided in disperse at the periphery of the area 22, an area of the multichip mask 12 can be effectively utilized, thereby not producing a useless area. Accordingly, a per-unit cost of the multichip mask 12 can be reduced.

All the chip patterns A, B, C, D and E are broad band operational amplifier circuits, and the constitutions thereof are described with reference to FIG. 3 to FIG. 7.

Figure 3:
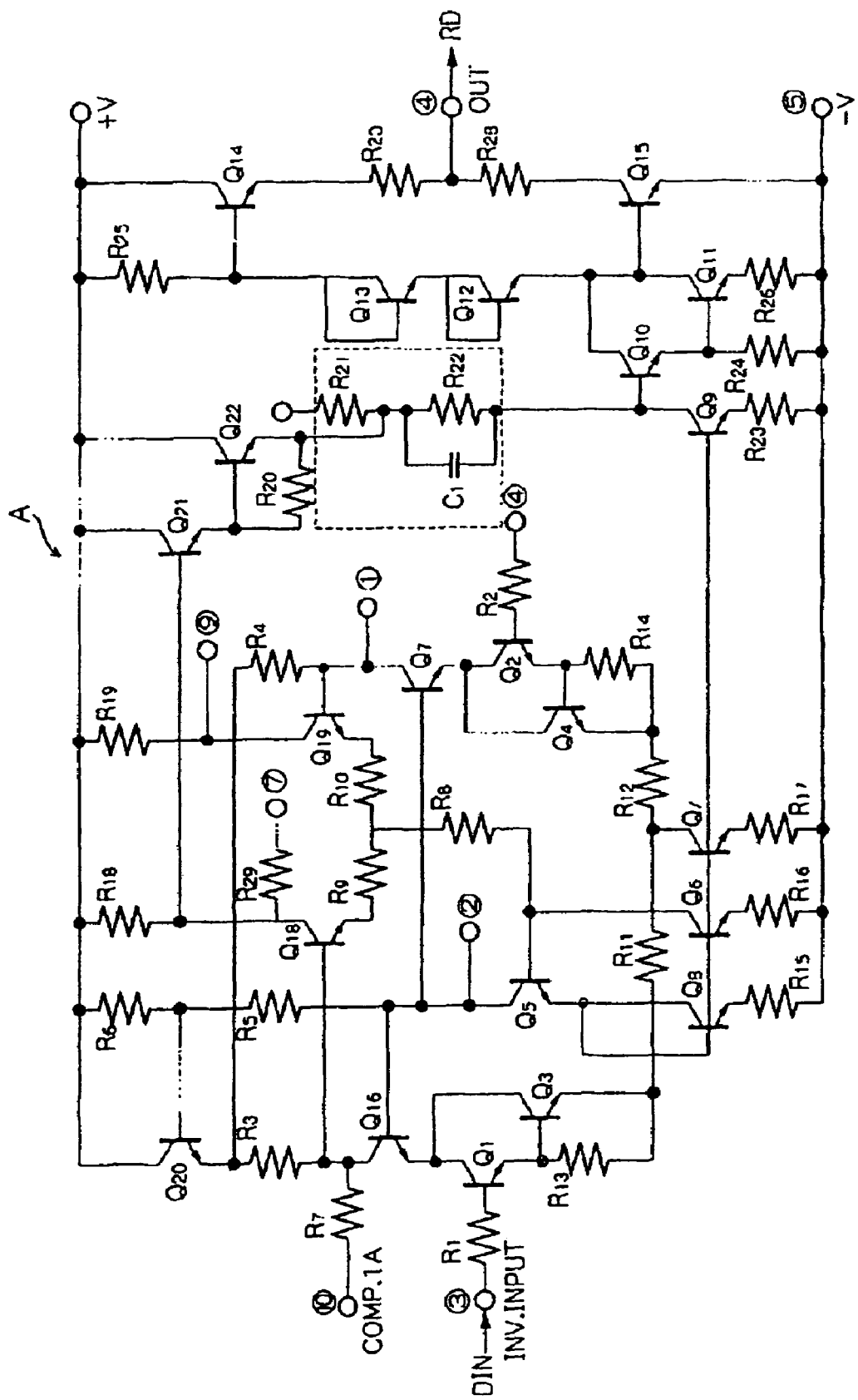
FIG. 3 is a circuit diagram showing a chip pattern A formed on the multichip mask according to the embodiment of the invention.

As shown in FIG. 3, the chip pattern A includes transistors $Q_1, Q_2, \ldots, Q_{22}$, resistors $R_1, R_2, \ldots, R_{29}$, capacitor $C_1$, and it amplifies an input data DIN from an external circuit, not shown, and outputs an output data RD.

Although the resistor $R_{21}$ is included in the chip pattern A, and end of the resistor $R_{21}$ is open. Accordingly, the resistor $R_{21}$ does not substantially contribute to the circuit operation.

Figure 4:
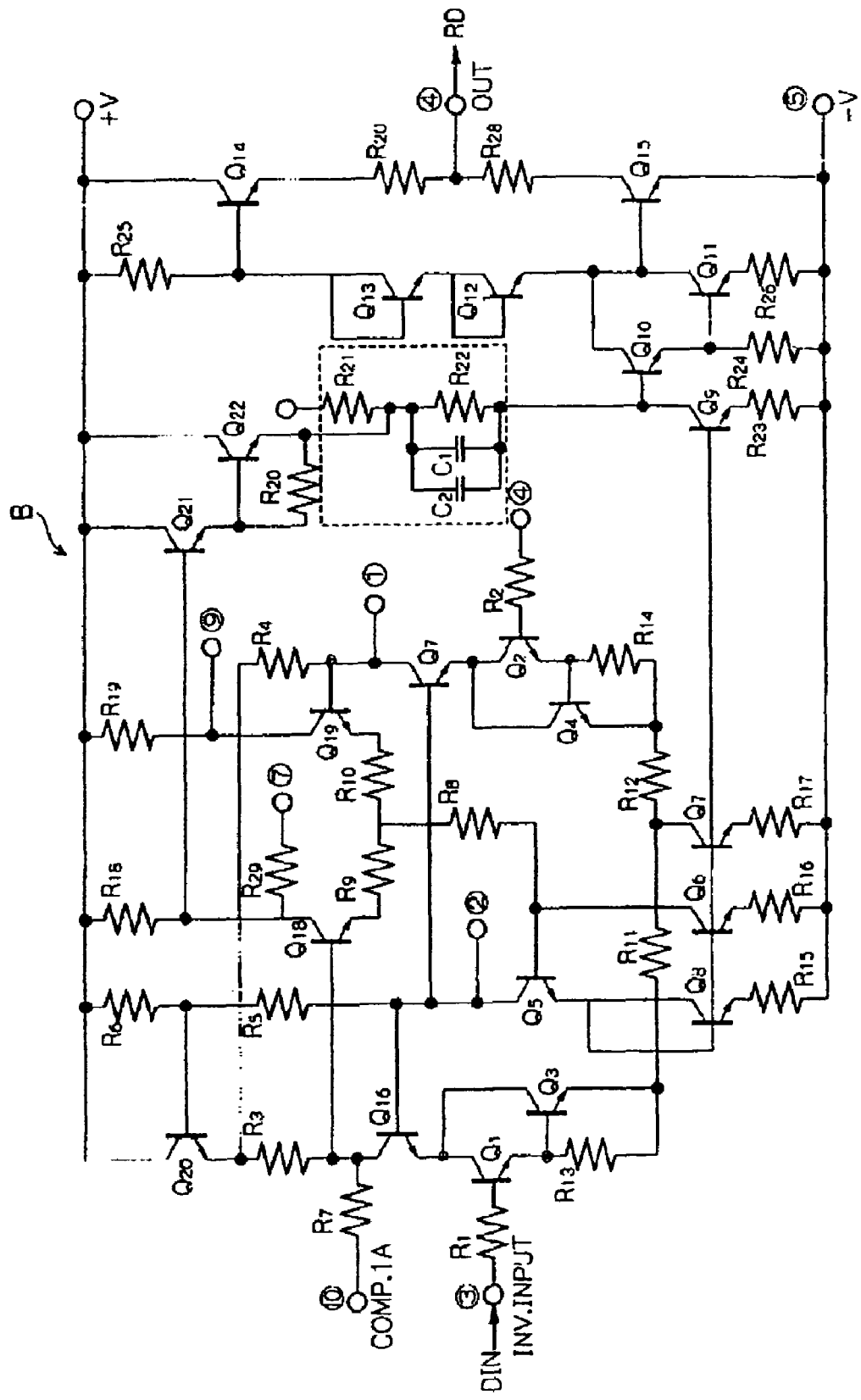
FIG. 4 is a circuit diagram showing a chip pattern B formed on the multichip mask according to the embodiment of the invention.

Next, as shown in FIG. 4, a chip pattern B includes transistors $Q_1, Q_2, \ldots, Q_{22}$, resistors $R_1, R_2, \ldots, R_{29}$, capacitors $C_1, C_2$ and is structured to add the capacitor $C_2$ to the chip pattern A (a portion encircled by the dotted line). The chip pattern B amplifies an input data DIN from an external circuit, not shown, and outputs an output data RD, in the same manner as the chip pattern A.

Figure 5:
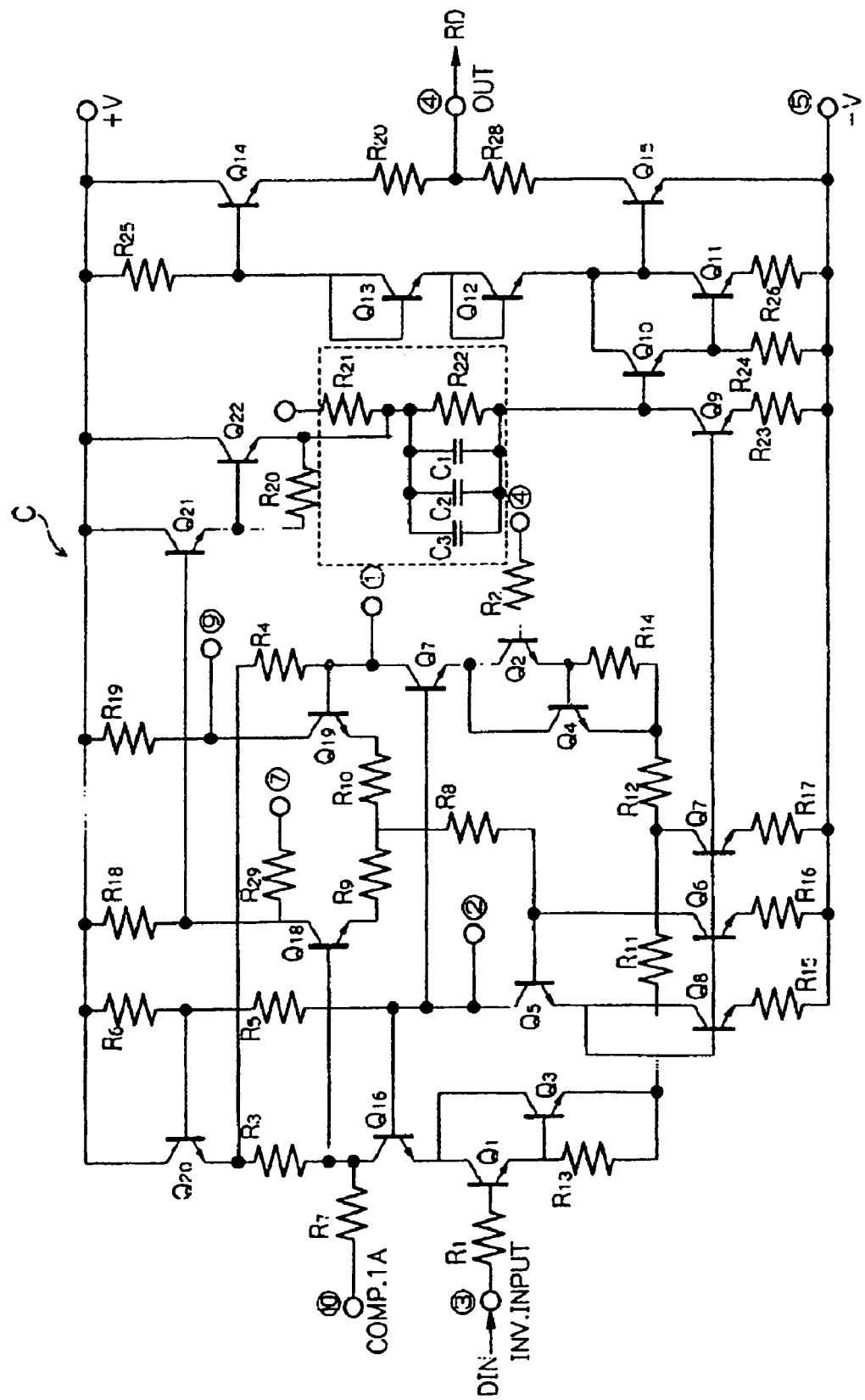
FIG. 5 is a circuit diagram showing a chip pattern C formed on the multichip mask according to the embodiment of the invention.

Next, as shown in FIG. 5, a chip pattern C includes transistors $Q_1, Q_2, \ldots, Q_{22}$, resistors $R_1, R_2, \ldots, R_{29}$, capacitors $C_1, C_2$ and $C_3$ and is structured to add the capacitor $C_3$ to the chip pattern B (a portion circled by the dotted line). The chip pattern C amplifies an input data DIN from an external circuit, not shown, and outputs an output data RD, in the same manner as the chip patterns A and B.

Figure 6:
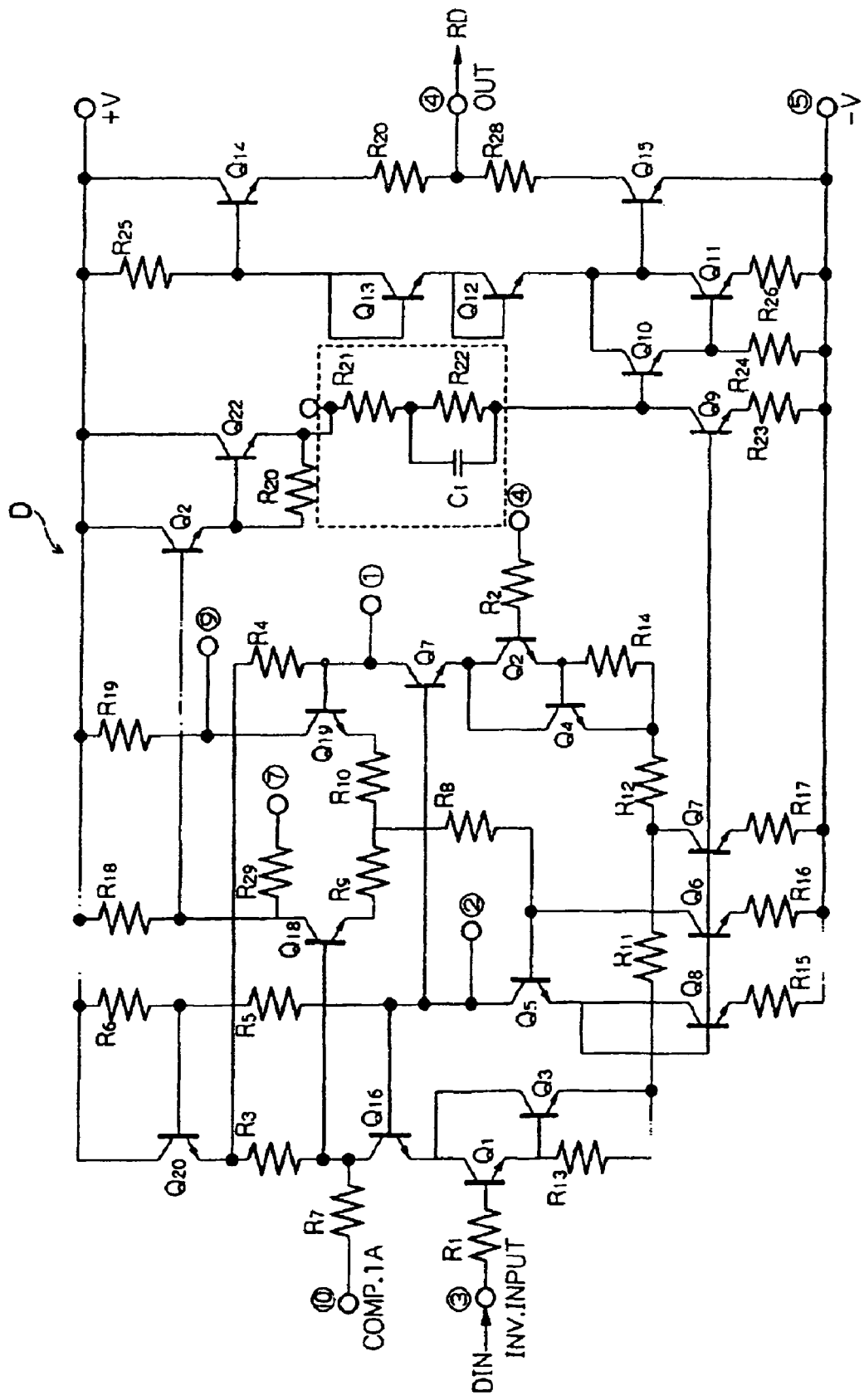
FIG. 6 is a circuit diagram showing a chip pattern D formed on the multichip mask according to the embodiment of the invention.

Next, as shown in FIG. 6, a chip pattern D includes transistors $Q_1, Q_2, \ldots, Q_{22}$, resistors $R_1, R_2, \ldots, R_{29}$, a capacitor $C_1$, and it is different from the chip pattern A in respect of the constitution surrounded by the dotted line in the same figure. Since the both ends of the $R_{21}$ are connected to other elements in the chip pattern D, the resistor $R_{21}$ contributes to the circuit operation. However, the chip pattern D amplifies an input data DIN from an external circuit, not shown, and outputs an output data RD, in the same manner as the chip patterns A, B and C.

Figure 7:
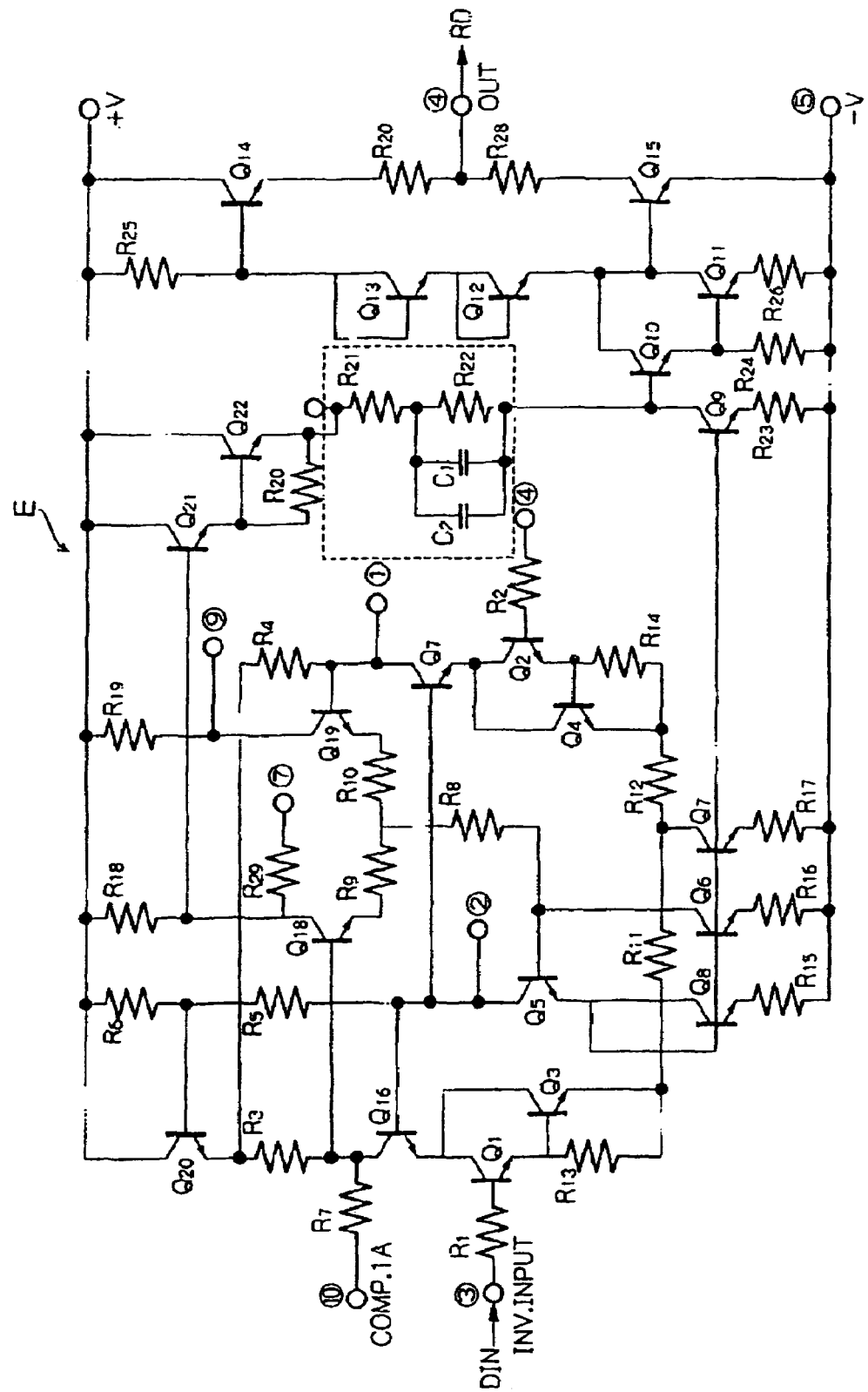
FIG. 7 is a circuit diagram showing a chip pattern E formed on the multichip mask according to the embodiment of the invention.

As shown in FIG. 7, a chip pattern E includes transistors $Q_1, Q_2, \ldots, Q_{22}$, resistors $R_1, R_2, \ldots, R_{29}$, capacitors $C_1$ and $C_2$ and is structured to add the capacitor $C_2$ to the chip pattern D (a portion encircled by the dotted line).

As set forth above, although the chip patterns A, B, C, D and E are different from one another in respect to the constitution of patterns in respect to the portions surrounded by the dotted lines in FIG. 3 to FIG. 7, they have the same function, and a chip pattern which is suitable for mass-production and exhibits an electric characteristic is selected among the chip patterns A, B, C, D and E.

Figure 8:
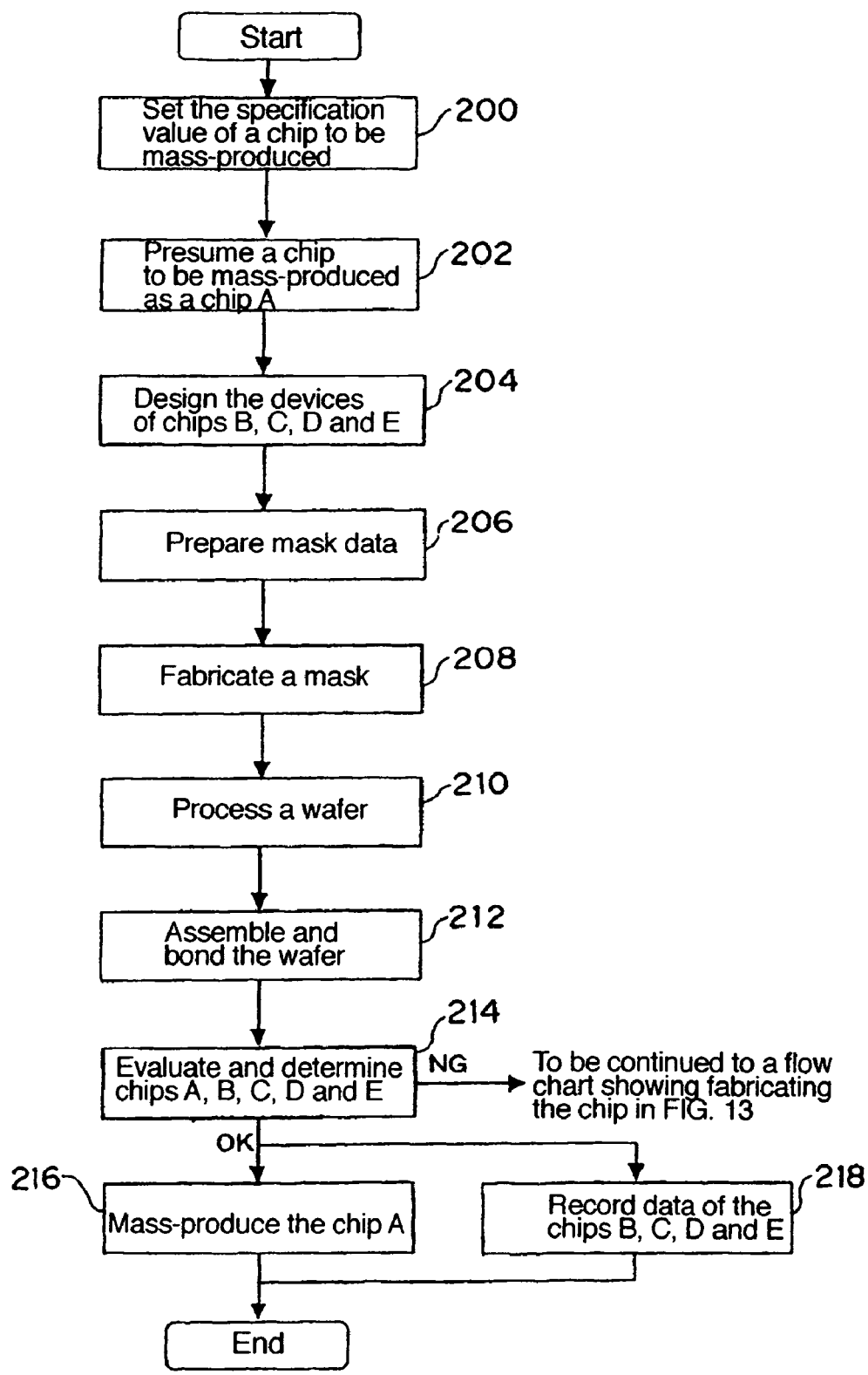
FIG. 8 is a flowchart showing a fabricating flow of the chip A which is fabricated by use of the multichip mask according to the embodiment of the invention.

A method of fabricating a chip is described next with reference to the flow chart in FIG. 8.

First, a program goes to step 200 where specification value of each chip to be mass-produced is set. Then, the program goes to step 202 where each chip to be mass-produced is presumed as a chip A corresponding to the chip pattern A. The chip A is evaluated and confirmed in electric characteristic before the program in the flow chart starts, and the electric characteristic at the time of evaluation satisfies the specification value which is set in step 200.

Then the program goes to step 204 where the devices of the chip patterns B, C, D and E are designed. The chip patterns B, C, D and E having the same function as the chip pattern A and satisfying the specification value, which is set in step 200, are designed by use of a computer and designing software.

The program goes to step 206 where a mask data of the multichip mask 12, on which the chip pattern A and chip patterns B, C, D and E which are designed in step 204 are arranged as shown in FIG. 2, is prepared.

Next, the program goes to step 208 where the multichip mask 12 is fabricated. Mask data which is fabricated in step 206 is transferred to a data controller (not shown) of a mask drawing unit. A mask blank with resist (not shown) is set on the mask drawing unit, and pattern drawing data is exposed and drawn onto the resist of the mask blank with resist. Thereafter, a pattern is formed after a pattern-developing step and the like, then the fabrication of the multichip mask 12 is completed after a pattern inspection step, a pattern correction step, and the like.

Figure 9A:
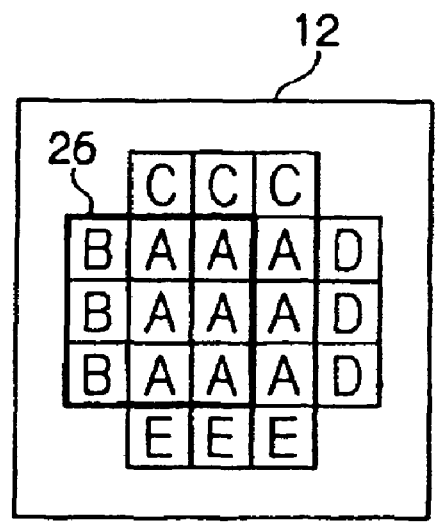
FIG. 9(A) is a view showing a multichip mask according to the embodiment of the invention and FIG. 9(B) is a view showing a wafer according to the embodiment of the invention.

Subsequently, the program goes to step 210 where the wafer 20 is subjected to a processing. First, the multichip mask 12 is moved in the direction of the arrows A and B as shown in FIG. 1 so that an area 26 (depicted by the bold line in the same figure) including three chip patterns B of the multichip mask 12 shown in FIG. 9(A) at the left end and six chip patterns A at the right side of the chip patterns B is aligned with the maximum exposure area of the projection exposure apparatus 10.

Figure 9B:
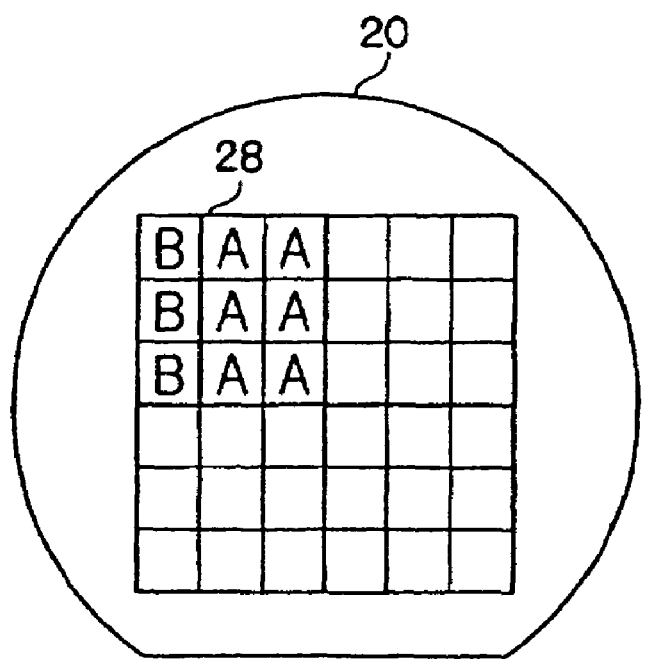

Then, as shown in FIG. 1, the wafer stage 18 is moved in the direction of the arrows C and D so that the exposure area of the projection exposure apparatus 10 is aligned with a wafer area 28 at the upper left portion of the wafer 20 shown in FIG. 9(B). Then, when the area 26 is subjected to exposure, exposed images of the chip patterns A and B are transferred to the wafer area 28.

Figure 10A:
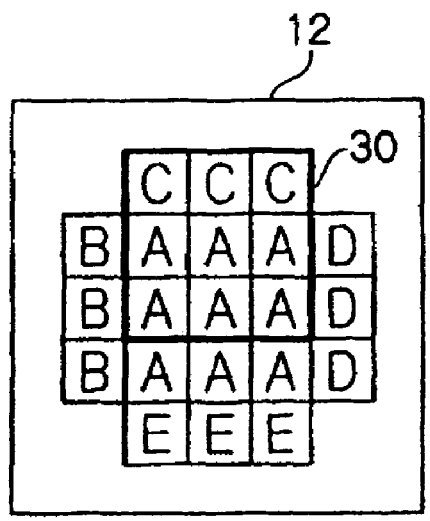
FIG. 10(A) is a view showing a multichip mask according to the embodiment of the invention and FIG. 10(B) is a view showing a wafer according to the embodiment of the invention.
Figure 10B:
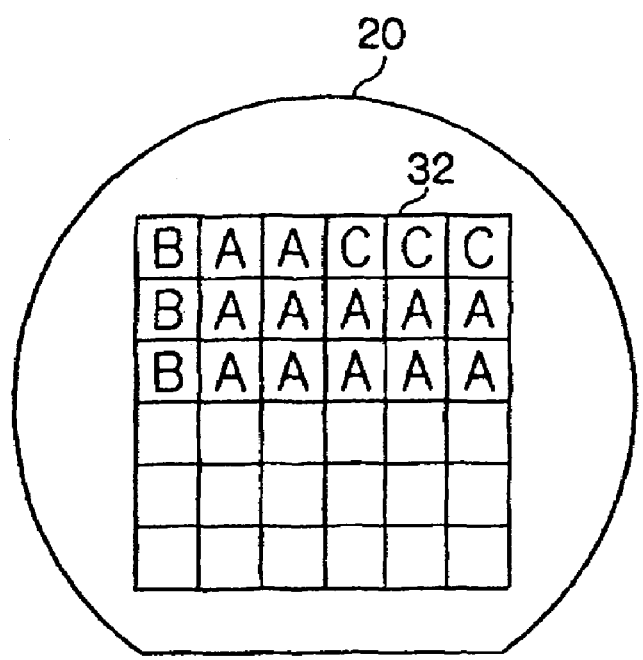

Then, as shown in FIG. 10(A), an area 30 including three chip patterns C of the multichip mask 12 at the upper end and six chip patterns A at the lower side is shifted to a wafer area 32 adjacent to the right side of the wafer area 28 shown in FIG. 10(B), namely, a transfer area of the wafer 20 is shifted counterclockwise to effect exposure.

Figure 11A:
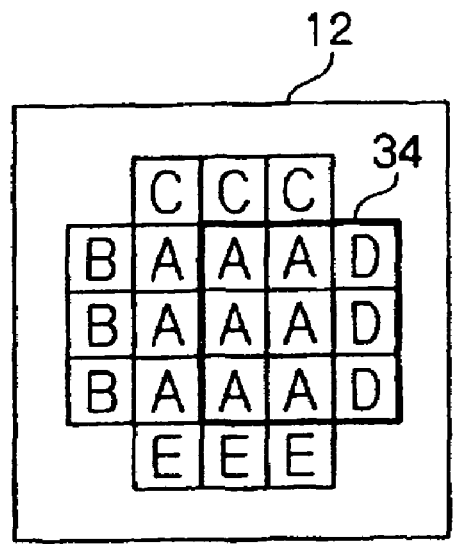
FIG. 11(A) is a view showing a multichip mask according to the embodiment of the invention and FIG. 11(B) is a view showing a wafer according to the embodiment of the invention.
Figure 11B:
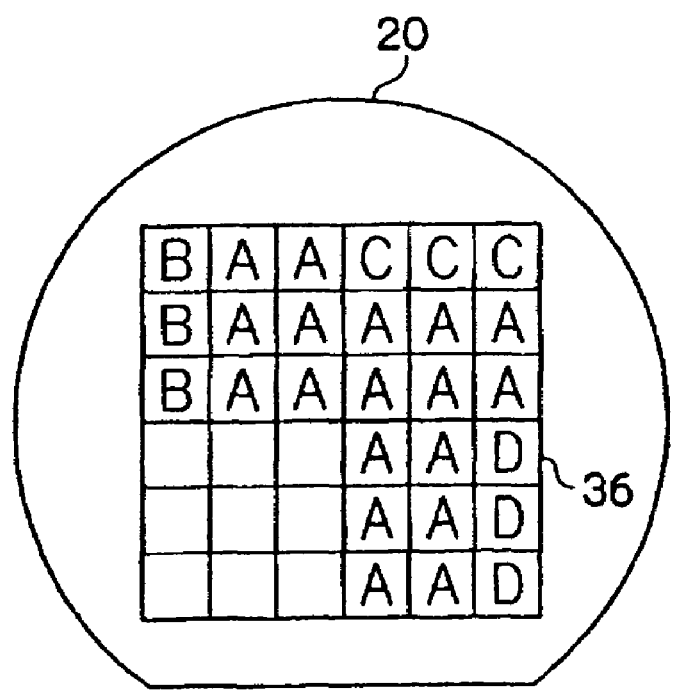
Figure 12A:
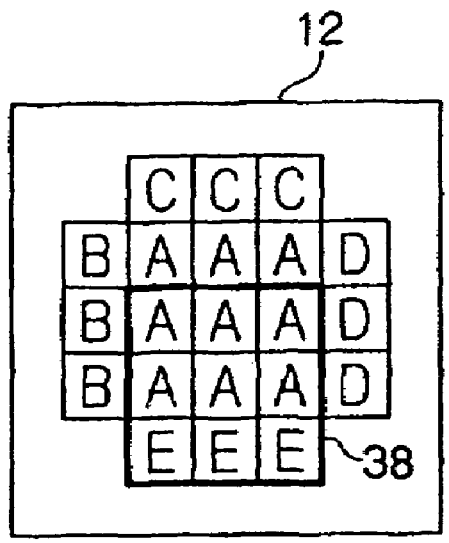
FIG. 12(A) is a view showing a multichip mask according to the embodiment of the invention and FIG. 12(B) is a view showing a wafer according to the embodiment of the invention.
Figure 12B:
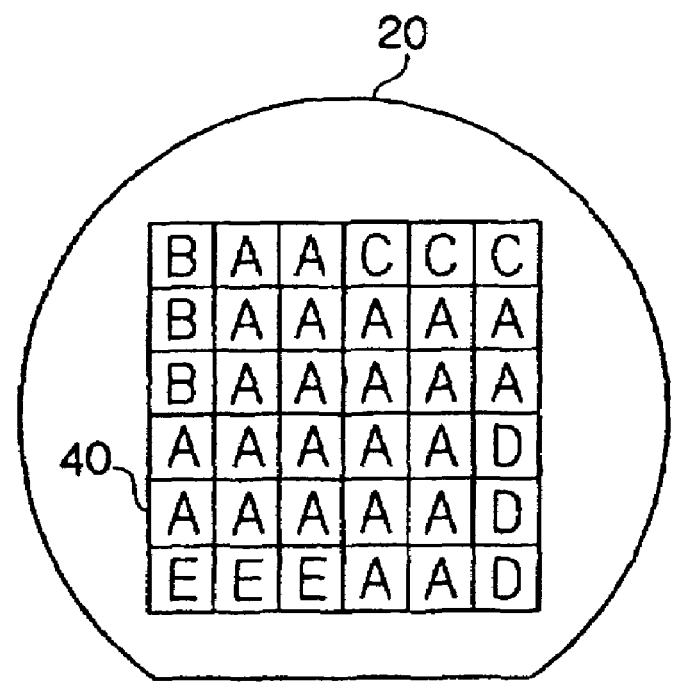

Likewise, an area 34 including the chip patterns D and A shown in FIG. 11(A) is exposed to a wafer area 36 which is shifted counterclockwise from the wafer area 32 shown in FIG. 11(B), while an area 38 including the chip patterns E and A shown in FIG. 12(A) is exposed to a wafer area 40 which is shifted counterclockwise from the wafer area 36 shown in FIG. 12(B).

When the exposure of the chip patterns A, B, C, D and E is completed and the inspection of the wafer 20 is completed, the program goes to step 212 where prototypes of chips are assembled and subjected to a sealing or bonding treatment. Also in step 212, the prototypes of chips A, B, C, D and E corresponding to the chip patterns A, B, C, D and E are completed after a back grinding step, a dicing step and the like.

As shown in FIG. 12(B), a large number of chips A are fabricated compared with other chips. As a result, the time for fabricating the prototypes of chips A can be shortened, thereby ensuring the time of supply of the prototypes of chips A.

Subsequently, the program goes to step 214 where the prototypes of chips A, B, C, D and E are evaluated and determined. If the chip A satisfies the specification value of the chip to be mass-produced which is set in step 200, it is determined that the chips A are mass-produced, then the program goes to step 216 where the chips A are mass-produced.

As shown in FIG. 2, the area 22 where the chip patterns A of the multichip mask 12 are formed at the time of prototyping the chips has the same size as the maximum exposure area of the projection exposure apparatus 10. Accordingly, the multichip mask 12 can be used as it is in the mass-production stage, and when the area 22 is subjected to exposure, the chip patterns A can be transferred onto the wafer 20 without wasting the exposure area of the projection exposure apparatus 10.

Further, it is not necessary to redesign and re-fabricate a reticle mask for mass production, and it is possible to transfer from a prototyping stage to a mass-production stage in a short period of time. Still further, a re-fabricating cost of the reticle mask can be reduced.

If the determination in step 214 where the determination of the chip pattern A is OK (affirmative), evaluation data of the chips B, C, D and E are recorded in step 218 in addition to the mass-production of the chips A. These data is of great utility in the next development stage.

Whereupon, if the determination is NG (negative) in step 214, a chip to be mass-produced is narrowed from the evaluated chips B, C, D and E in place of the chip A. A chip among the chips B, C, D and E, which satisfies the specification value in electric characteristic and suitable for mass-production, is assumed as a chip B.

Figure 13:
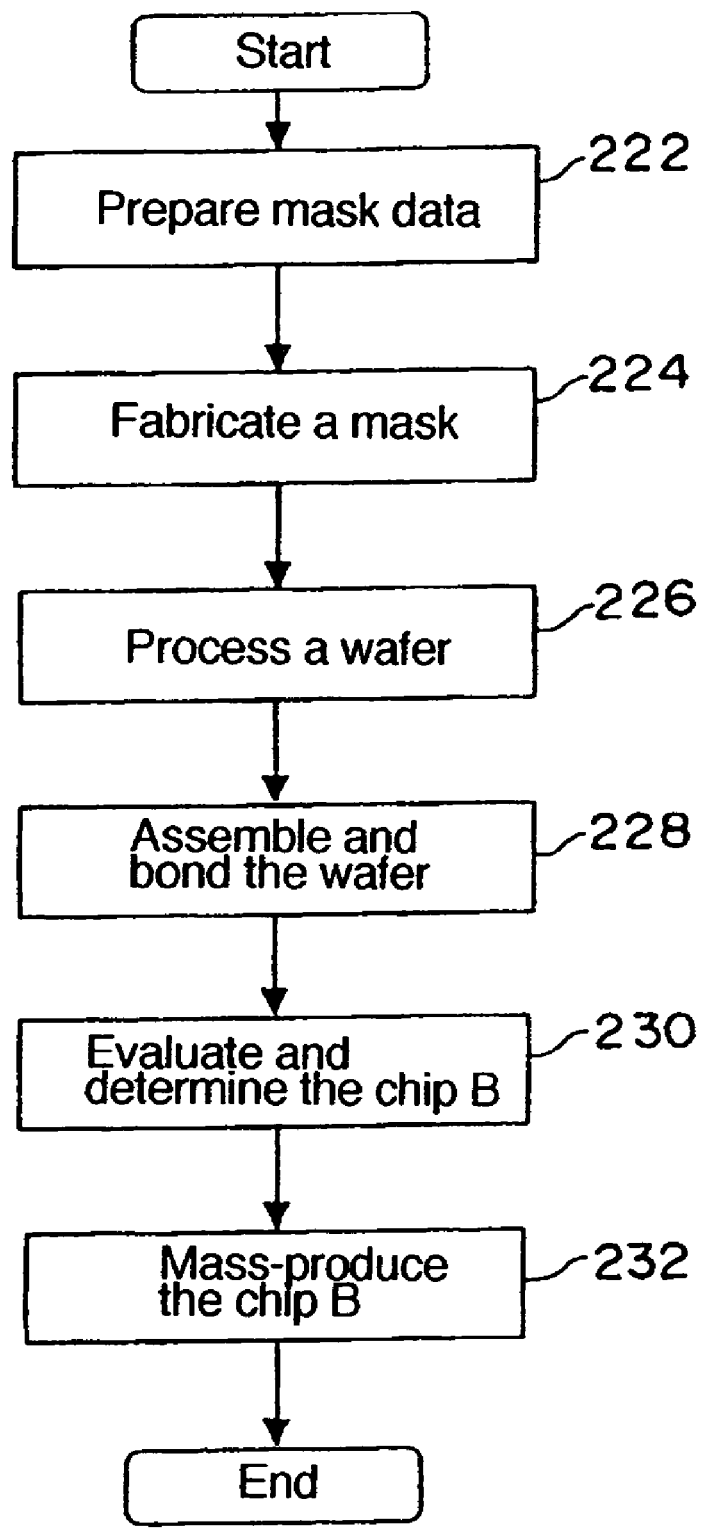
FIG. 13 is a flowchart showing a fabricating flow of the chip B which is fabricated by use of the multichip mask according to the embodiment of the invention.
Figure 14A:
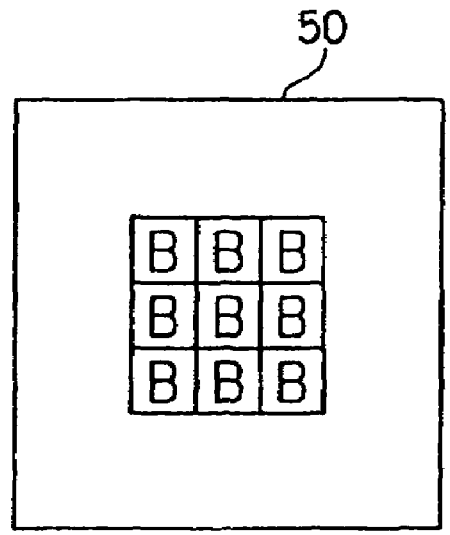
FIG. 14(A) is a view showing the multichip mask according to the embodiment of the invention and FIG. 14(B) is a view showing a wafer according to the embodiment of the invention.
Figure 14B:
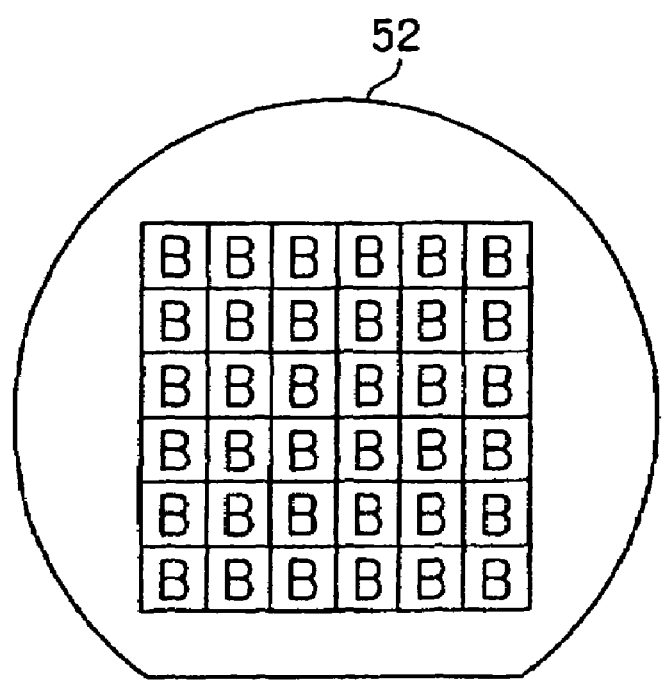
Figure 15A:
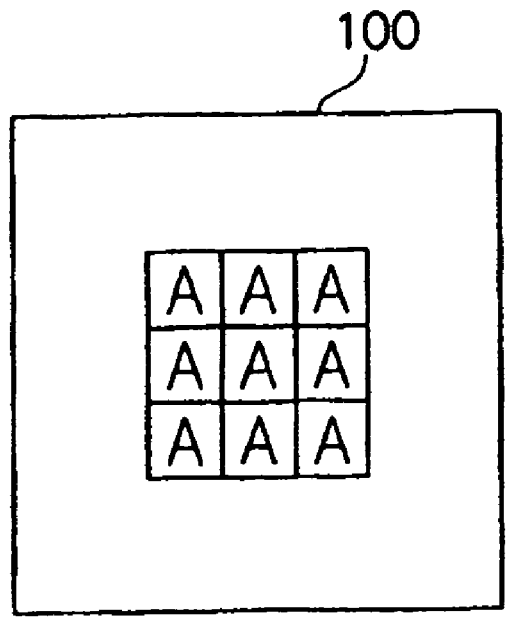
FIG. 15(A) is a view showing a conventional multichip mask and FIG. 15(B) is a view showing a conventional wafer.
Figure 15B:
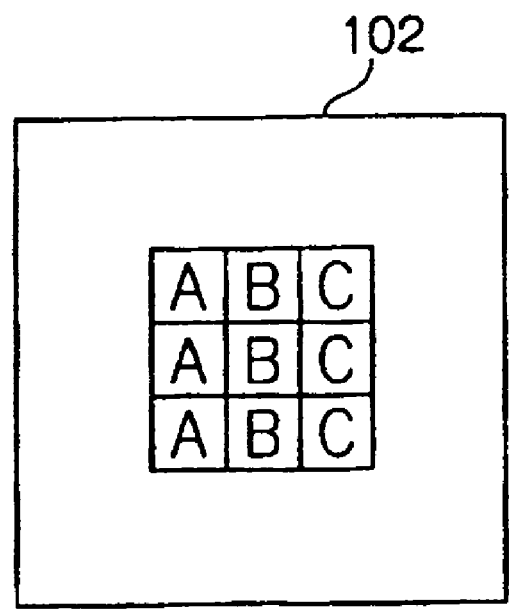
Figure 16:
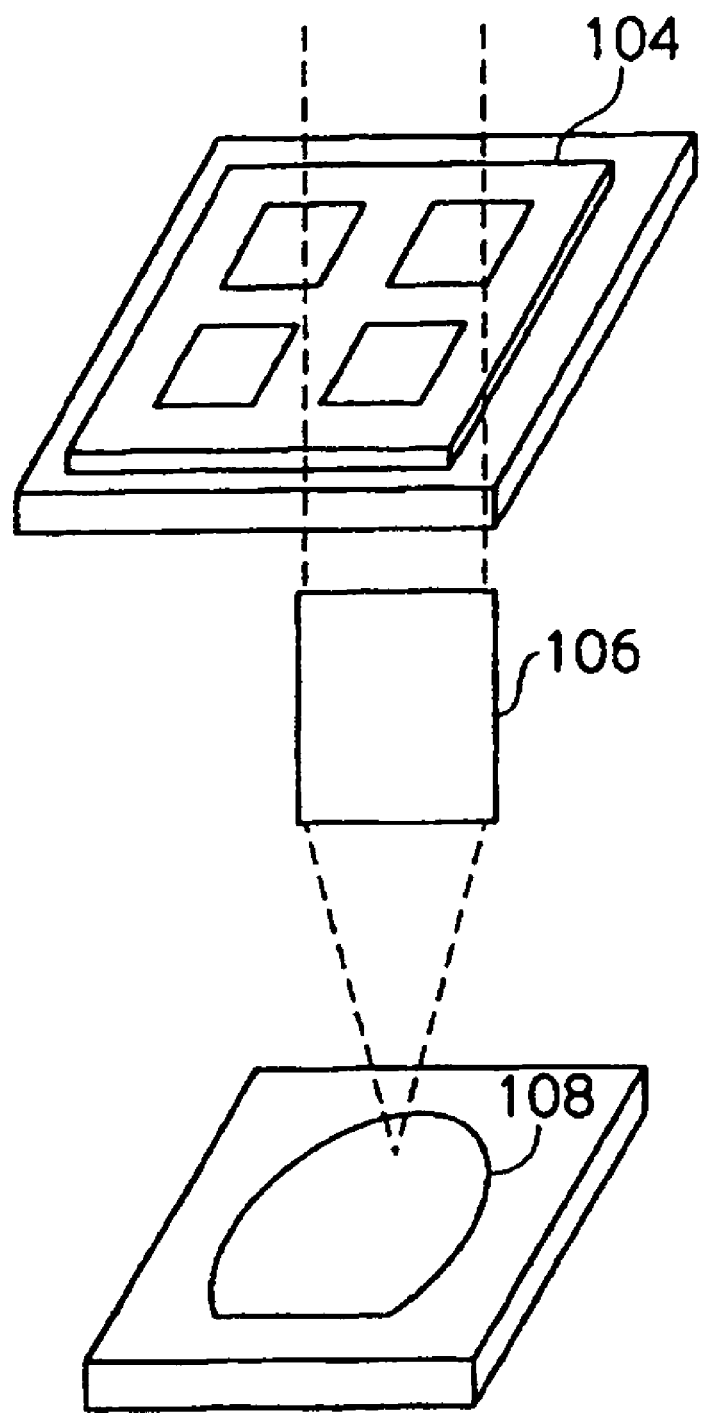
FIG. 16 is a perspective view showing a conventional projection exposure apparatus.

As shown in a flow chart showing the fabrication of the chip in FIG. 13, the program goes to step 222 where a reticle mask 50 of the chip B shown in FIG. 14 is designed. In step 222, only the chip pattern B corresponding to the chip B is formed on the maximum exposure area of the projection exposure apparatus 10. In step 224, the reticle mask 50 is fabricated, and the program goes to step 226 where the wafer is subjected to processes. In step 222, only the chip pattern B is exposed onto a wafer 52.

Then the program goes to step 228 where the wafer is assembled and bonded so as to fabricate the prototype of the chip B, thereafter goes to step 230 where the chip B is evaluated and determined. If the electric characteristic of the chip B satisfies the chips for mass-production, the mass-production of the chip B is determined, and goes to step 232 where the chips B are mass-produced.

Although the flow chart showing the fabrication of the chip B was described, the chips B, C, D and E have to be evaluated immediately after the determination of NG of the chip A in place of the chip A. This is caused by the fact that the chip patterns B, C, D and E are formed on the multichip mask 12 which was used when prototyping the chip A. As a result, the time taken from the determination of NG of the chip A to the mass-production of the chip B is shortened.

According to the preferred embodiment of the invention, all the chip patterns B, C, D and E have the same function as the chip pattern A, and a chip pattern corresponding to a chip to be mass-produced is selected from five types of chip patterns, but the invention is not limited to such examples, and hence any of the chip patterns B, C, D and E may have a chip pattern having the function completely different from that of the chip pattern A.

In this case, a new circuit to be evaluated is formed on the same multichip mask and subjected to prototyping and evaluation so that the time for developing the next stage chip can be shortened. Further, with the evaluation set forth above, it is conjectured as a chip pattern corresponding to a chip to be mass-produced like the chip pattern A as illustrated in a preferred embodiment of the invention.

With the construction of the invention, the chips can be prototyped and mass-produced by the same photomask, and the exposing area of the projection exposure apparatus can be utilized to the greatest extent.

What is claimed is:

1. A photomask for projecting, from an exposure area, a chip pattern onto a wafer, said photomask comprising:
   a first mask pattern having patterns of a first chip, and having a first size corresponding to a maximum exposure area; and
   a second mask pattern having patterns of a second chip, said patterns of the second chip being different from said patterns of the first chip, having a second size which is smaller than the first size, and being arranged adjacent to said first mask pattern, wherein
   said photomask is alignable such that only said first mask pattern is projected onto the wafer, and
   said photomask is alignable such that a portion of said first mask pattern and at least a portion of said second mask pattern are simultaneously projected onto the wafer.

2. The photomask according to claim 1, wherein said first mask pattern is a mask pattern for mass-production.

3. The photomask according to claim 1, wherein said first mask pattern is disposed at a center of said photomask and said second mask pattern is disposed at a periphery of said first mask pattern.

4. A photomask for projecting, from an exposure area, a chip pattern onto a wafer, said photomask comprising:
   a main mask pattern having patterns of a first chip, and having a first size corresponding to a maximum exposure area; and
   a sub-mask pattern having patterns of a second chip, said patterns of the second chip being different from said patterns of the first chip, having a second size which is smaller than the first size, and being arranged adjacent to said main mask pattern, wherein
   said photomask is alienable such that only said main mask pattern is projected onto the wafer, and
   said photomask is alienable such that a portion of said main mask pattern and at least a portion of said sub-mask pattern are simultaneously projected onto the wafer.

5. The photomask according to claim 4, wherein said main mask pattern is a mask pattern for mass-production.

6. The photomask according to claim 4, wherein said main mask pattern is disposed at a center of said photomask and said sub-mask pattern is disposed at a periphery of said main mask pattern.

* * * * *